United States Patent [19]

Ramirez

[11] Patent Number: 5,781,053
[45] Date of Patent: Jul. 14, 1998

[54] POSITIVE EDGE TRIGGERED FLIP FLOP

[75] Inventor: Sergio R. Ramirez, Austin, Tex.

[73] Assignee: Advanced Micro Devices Inc., Sunnyvale, Calif.

[21] Appl. No.: 701,016

[22] Filed: Aug. 21, 1996

[51] Int. Cl.$^6$ .................................................. H03K 3/037
[52] U.S. Cl. ........................ 327/215; 327/202; 327/218
[58] Field of Search ............................. 327/197, 200, 327/201, 202, 215, 218, 219, 220, 225, 228, 229, 230, 170, 24, 199, 203, 208, 210–212, 217, 209

[56] References Cited

U.S. PATENT DOCUMENTS

| | | | |
|---|---|---|---|
| 4,855,617 | 8/1989 | Ovens | 327/217 |
| 4,893,028 | 1/1990 | Beltramini | 327/199 |
| 5,051,610 | 9/1991 | Terane et al. | 327/217 |
| 5,200,649 | 4/1993 | Fukui | 327/212 |

FOREIGN PATENT DOCUMENTS

| | | | |
|---|---|---|---|
| 358043614A | 3/1983 | Japan | 327/215 |

OTHER PUBLICATIONS

Schilling et al., "Electronic Circuits, Discrete and Integrated", 3rd ed., pp. 547–549, 1989.

Thomas McCalla, Digital Logic and Computer Design, 1992, pp. 261–291.

P. Vignron, Coherent Design of Asynchronous Circuits, Published in IEE Proceedings E (Computers and Digital Techniques), vol. 130, Part E, No. 6, pp. 190–202, Nov. 1983.

*Primary Examiner*—Timothy P. Callahan
*Assistant Examiner*—Eunja Shin
*Attorney, Agent, or Firm*—Foley & Lardner

[57] ABSTRACT

A positive edge triggered flip flop which includes a master stage and a slave stage. The master stage includes an inverter that receives a clock input (C), and a first NAND gate having one input port for receiving a data input (D). The master stage also includes a second NAND gate and a first NOR gate that have their respective output connected to an input port of the other gate. The slave stage receives an inverted clock output from the inverter of the master stage. The slave stage includes a third NAND gate and a second NOR gate that also have their respective output connected to an input port of the other gate. An output value (Y) is read from the output of the second NOR gate.

10 Claims, 10 Drawing Sheets

** = POSITIVE EDGE TRIGGERED

FIG. 16

POSITIVE EDGE TRIGGERED FLIP FLOP

BACKGROUND OF THE INVENTION

1. Field of the Invention

The invention relates to a positive edge triggered flip flop. In particular, the invention relates to a single phase, positive edge triggered flip flop that solves clock skew problems associated with conventional positive edge triggered flip flops.

2. Description of the Related Art

Figure 1:
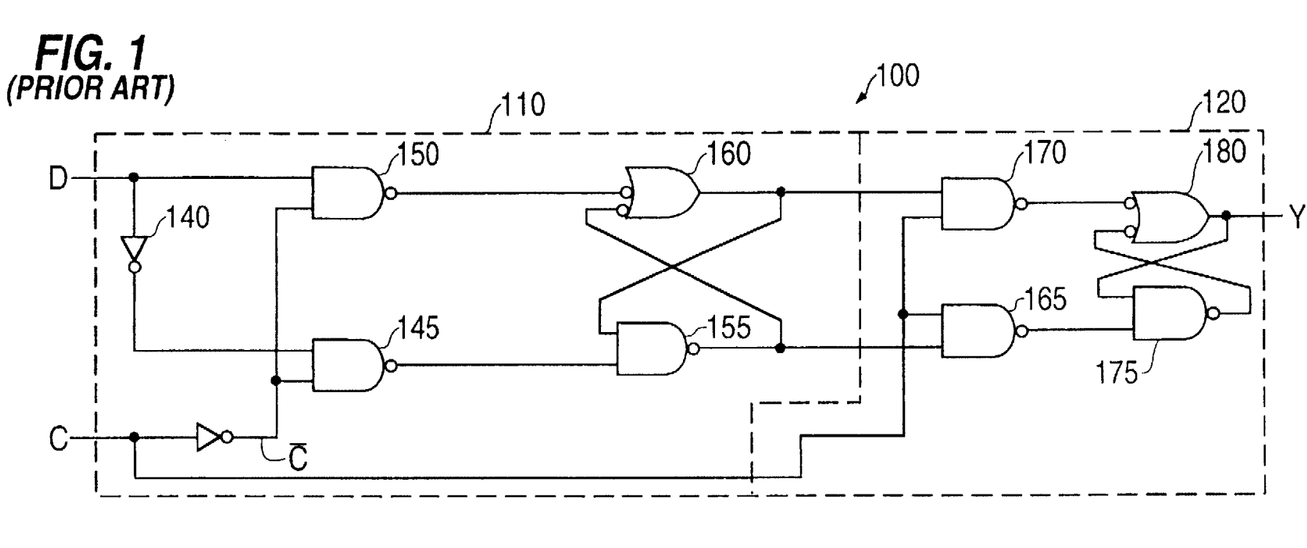
FIG. 1 shows a circuit diagram of a conventional master-slave positive edge-triggered D-type flip flop.

A conventional positive edge triggered, D-type master-slave flip flop is shown in FIG. 1. The flip flop 100 has a data input "D", a clock input "C", and an output "Y" (which is also referred to as "Q" in various textbooks and articles). The flip flop 100 includes a "master section" 110 and a "slave section" 120. The master section 110 is clocked by the inverted clock signal "$\overline{C}$", which is output from the inverter 130, and the slave section is clocked by the clock signal "C". Both sections 110, 120 are positive edge triggered. The master section 110 includes an inverter 140, a NAND gate 145, a NAND gate 150, a NAND gate 155, and a NAND Gate 160. The slave section 120 includes the inverter 130, a NAND Gate 165, a NAND Gate 170, a NAND Gate 175, and a NAND Gate 180.

The characteristics of a positive edge triggered D-type flip flop are listed below.

a) An input "D" provides the input data to be stored in the flip flop.

b) An input "C" receives a clock signal which controls when the input data is loaded in the flip flop.

c) An output "Y" provides a value which is stored in the flip flop. The output "Y" may also be a state variable.

d) A set of state variables $y_i$ determine the status of the flip flop (i.e., $y_k$=current output value, $y_{k-1}$=most previous output value, $y_{k-2}$=second most previous output value). For example, if the output y started at a "zero" value, then became a "one" value for the next four clock pulses, and then became a "zero" value for the current clock pulse, the flip flop's output would be characterized by:

$y_0=0, y_1=1, y_2=1, y_3=1, y_4=1, y_5=0.$ e) The flip flop stores the value of the input "D" into the output "y" when the control variable "C" makes a transition from zero to one (i.e., rising edge of a clock pulse).

Property e), described above, defines a set of sequences which uniquely determines the state of the flip flop. Various types of sequences are possible for the flip flop, and they include: a) load sequences, b) invalid sequences, c) negative edge sequences, and d) input data change sequences (i.e., positive edge sequences). Each of these sequences will be discussed in detail hereinbelow.

Load Sequences

If "D" is fixed and the clock "C" makes a transition from zero to one, the output function "y" gets the value of the input "D". The load sequences are defined in Table 1.

TABLE 1

| | Load Sequences | | | |
|---|---|---|---|---|
| | Time | 0 | 1 | 2 |
| a1 | D | 0 | 0 | 0 |
| | C | 0 | 1 | 1 |

TABLE 1-continued

| | Load Sequences | | | |
|---|---|---|---|---|
| | Time | 0 | 1 | 2 |
| | Y | X | X | 0 |
| a2 | D | 1 | 1 | 1 |
| | C | 0 | 1 | 1 |
| | Y | X | X | 1 |

X = don't care (can be either 0 or 1)

Invalid Sequences

Table 2 lists the various invalid sequences for the D-type positive edge triggered flip flop. For the flip flop, changing both the input "D" and the input "C" simultaneously leads to indeterminate results. These indeterminate results are primarily due to setup time violations for the flip flop due to the simultaneous input value changes.

TABLE 2

| | Invalid Sequences | | |
|---|---|---|---|
| | Time | 0 | 1 |
| b1 | D | 0 | 1 |
| | C | 1 | 0 |
| | Y | y | — |
| b2 | D | 1 | 0 |
| | C | 0 | 1 |
| | Y | y | — |
| b3 | D | 0 | 1 |
| | C | 0 | 1 |
| | Y | y | — |
| b4 | D | 1 | 0 |
| | C | 1 | 0 |
| | Y | y | — |

— = undefined (either 0 or 1, no guarantee as to its value)
y = the present value of Y, may be 0 or 1

Negative Edge Sequences

Table 3 lists the various negative edge sequences for the D-type positive edge triggered flip flop. Changing the clock "C" from one to zero while holding the input "D" fixed does not affect the output Y.

TABLE 3

| | Negative Edge Sequences | | |
|---|---|---|---|
| | Time | 0 | 1 |
| c1 | D | 0 | 0 |
| | C | 1 | 0 |
| | Y | 0 | 0 |
| c2 | D | 0 | 0 |
| | C | 1 | 0 |
| | Y | 1 | 1 |
| c3 | D | 1 | 1 |
| | C | 1 | 0 |
| | Y | 0 | 0 |
| c4 | D | 1 | 1 |
| | C | 1 | 0 |
| | Y | 1 | 1 |

Input Data Change Sequences

Table 4 lists the various input data change sequences. Changing the input data "D" while the holding the clock "C" fixed does not affect the output y.

TABLE 4

| Input Data Change Sequences | | | |
|---|---|---|---|
| | Time | 0 | 1 |
| d1 | D | 0 | 1 |
| | C | 0 | 0 |
| | Y | y | y |
| d2 | D | 1 | 0 |
| | C | 1 | 1 |
| | Y | y | y |
| d3 | D | 1 | 0 |
| | C | 0 | 0 |
| | Y | y | y |
| d4 | D | 0 | 1 |
| | C | 1 | 1 |
| | Y | y | y | y = The present value of Y, may be 0 or 1

Figure 2:
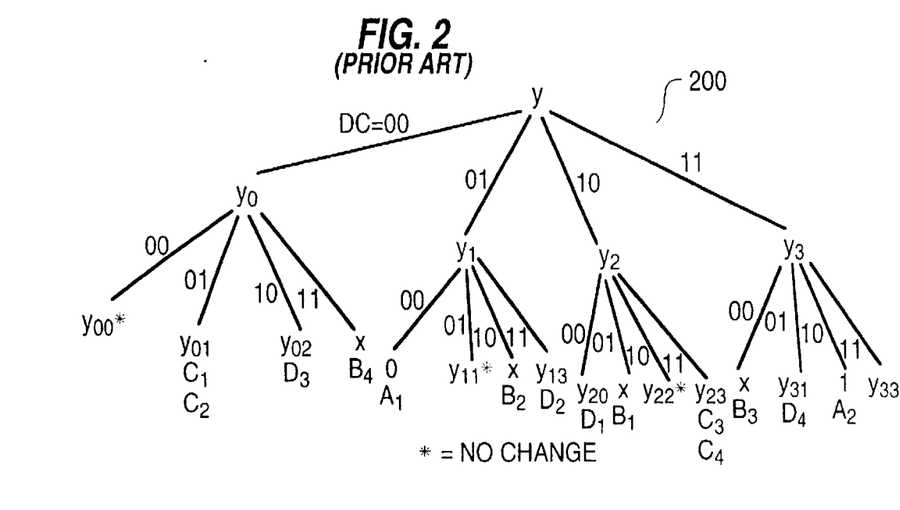
FIG. 2 shows a tree obtained using Vignron's synthesis method in obtaining a conventional D-type positive edge-triggered flip flop.

These sequences (a1, a2, b1, b2, ..., d4), together with the fact that if the input "D" does not change, the state should remain the same, forms the basis for constructing a decision tree 200 used in Vignron's synthesis method, as given in FIG. 2. Vignron's synthesis method has been taken from "Coherent Design of Asynchronous Circuits", by P. Vignron, published in "IEE Proceedings on Computers and Digital Techniques", Nov., 1993, also published as a PHD Dissertation entitled "Analysis of the Theory of Sequential Circuits", Technical University of Vienna, 1972.

In FIG. 2, the state transitions are from the bottom of the tree 200 to the top of the tree 200. The states indicated by an asterisk (*) are those states in which there is no change in both the input "D" and the clock "C" from a previous state.

Figure 3A:
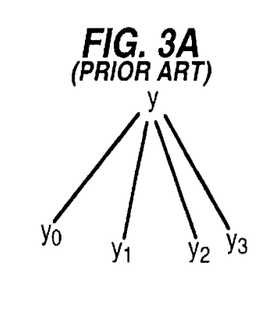
FIGS. 3A–3C show subtrees used to provide a first simplification of the tree used in obtaining the conventional D-type positive edge-triggered flip flop.
Figure 3B:
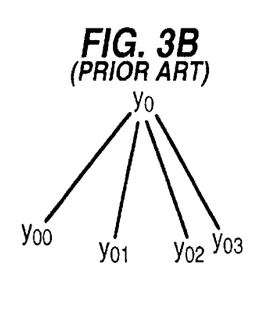
Figure 3C:
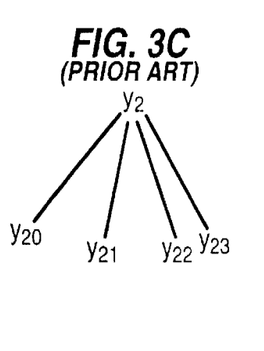
Figure 4:
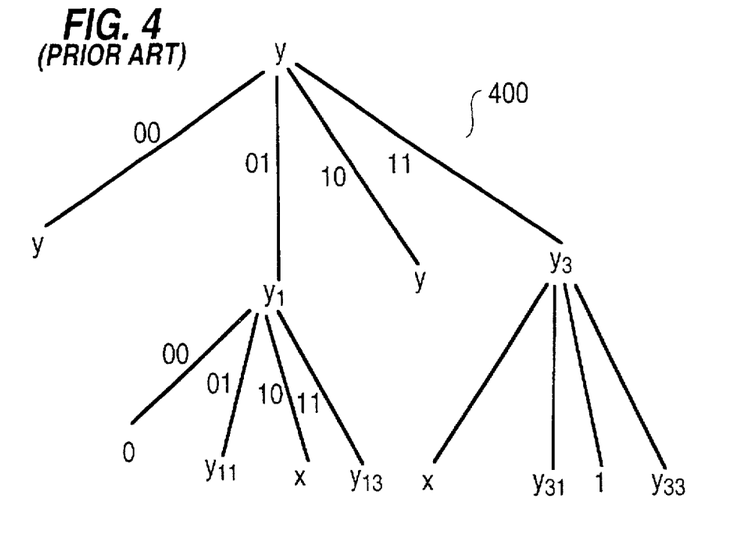
FIG. 4 shows a first simplified tree used in obtaining the conventional D-type positive edge-triggered flip flop.
Figure 5A:
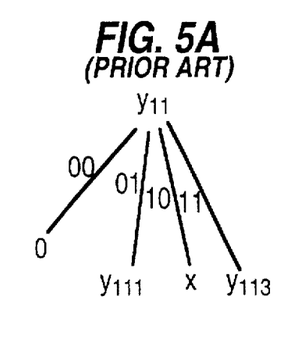
FIGS. 5A–5D show sub-trees used for further simplifying the first simplified tree in order to obtain the conventional D-type positive edge-triggered flip flop.
Figure 5B:
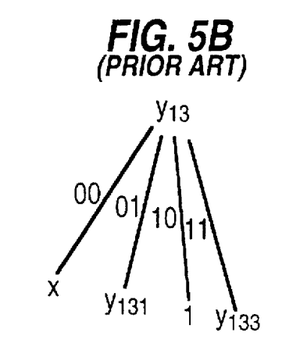
Figure 5C:
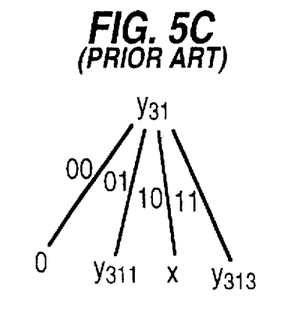
Figure 5D:
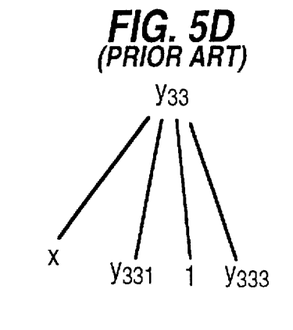

If arbitrary states $y_{o3}$ and $y_{21}$ are assigned to the sequences b4 (11→00) and b1 (01→10), equivalent state variables may be assigned to the states $y_0$, $y_2$ and y, as shown in FIGS. 3A–3C, respectively. Applying these substitutions to the tree 200 results in a first simplified tree 400, as shown in FIG. 4.

Similarly, the states $y_{11}$, $y_{13}$, $y_{31}$ and $y_{33}$ follow recursive relationships. Decision trees for $y_{11}$, $y_{13}$, $y_{31}$ and $y_{33}$ are respectively shown in FIGS. 5A–5D. From FIGS. 5A–5D, the following relationship may be determined:

$$y_1 = y_{11} = y_{31}, \quad y_3 = y_{13} = y_{33}.$$

Figure 6:
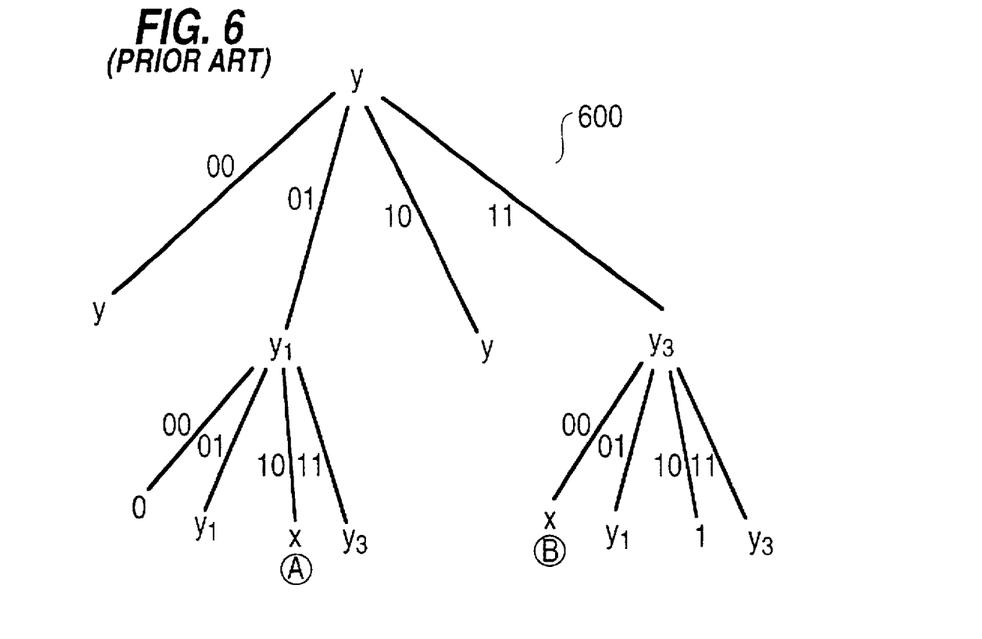
FIG. 6 shows a second simplified tree used in obtaining the conventional D-type positive edge-triggered flip flop.

Applying these substitutions to the first simplified tree 400 results in a second simplified tree 600, as shown in FIG. 6. Based on the simplified tree 600, one can then synthesize a positive edge triggered flip flop, in a manner as described below.

Figure 7A:
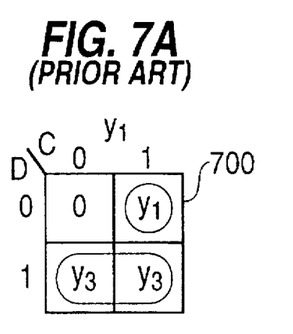
FIGS. 7A and 7B show Karnaugh maps that are obtained from the second simplified tree.
Figure 7B:
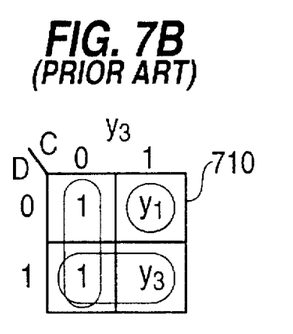

If sequence A (see FIG. 6) is assigned a value of $y_3$ and sequence B (see FIG. 6) is assigned a value of one ("1"), the following relationships can be obtained from the Karnaugh maps 700 and 710 of FIGS. 7A and 7B, respectively.

$$y_1 = \bar{D}Cy_1* + Dy_3*$$

$$y_3 = \bar{D}Cy_1* + Dy_3* + \bar{C},$$

where * represents a delayed (or most previous) version of the value. For example, if $y_3=1$ at clock pulse 5, and $y_3=0$ at the next clock pulse 6, then if clock pulse 6 is the current clock pulse, $y_3=0$ and $y_3*=1$.
Therefore, $$y_3 = y_1 + \bar{C}$$

From the foregoing, the following expression is obtained:

$$y_3 + y_1 = y_3$$

Figure 8A:
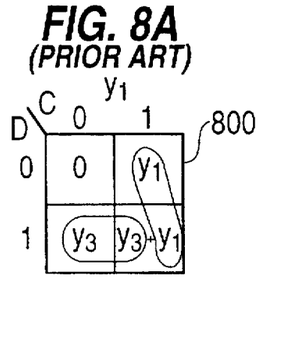
FIGS. 8A and 8B show Karnaugh maps that are obtained from minimization procedures performed on the Karnaugh maps of FIGS. 7A and 7B.
Figure 8B:
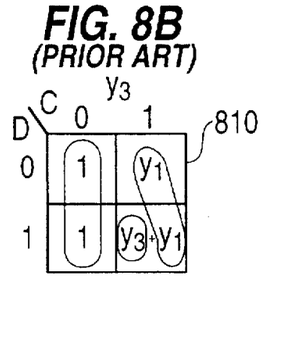

This expression can then be used in a Karnaugh map minimization procedure, to obtain the maps 800 and 810 respectively shown in FIGS. 8A and 8B.

From the Karnaugh maps 800 and 810 of FIGS. 8A and 8B, the following relationships are obtained:

$$y_1 = y_1 * \bar{C} + y_3 * D \tag{A}$$

$$y_3 = y_1 * \bar{C} + y_3 * D + \bar{C} \tag{B}$$

Figure 9A:
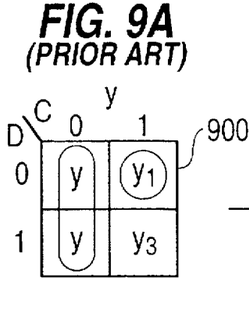
FIGS. 9A and 9B show Karnaugh maps that are used to obtain the relationships of the output y in order to obtain the conventional D-type positive edge-triggered flip flop.
Figure 9B:
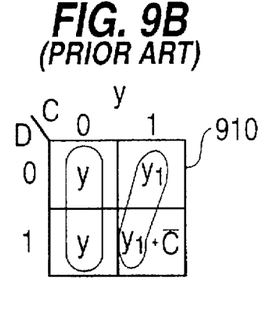

The output variable Y can be obtained from the Karnaugh maps 900 and 910 as respectively shown in FIGS. 9A and 9B. The equations which define the output variable Y are given by the following relationship:

$$Y = y * \bar{C} + y_1 C + DC\bar{C}$$

Since DCC is equal to zero, we get:

$$Y = y * \bar{C} + y_1 C$$

Figure 10A:
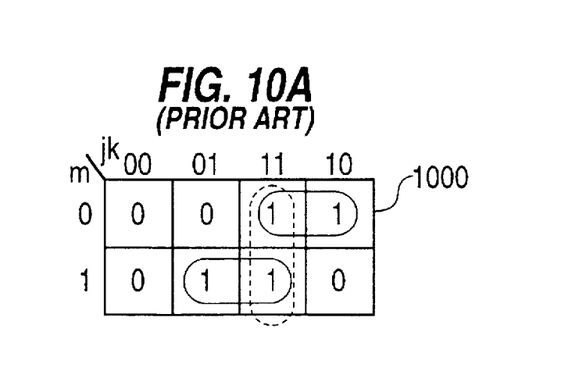
FIG. 10A shows a Karnaugh map having a multiplexer relationship that was obtained from the Karnaugh map of FIG. 9.
Figure 10B:
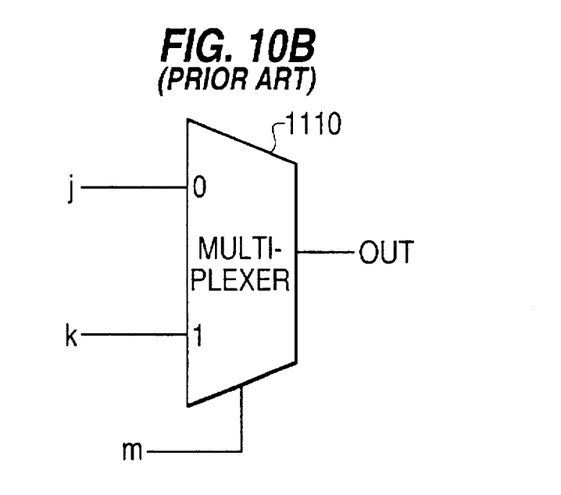
FIG. 10B shows a multiplexer that operates according to the relationships given in the Karnaugh map of FIG. 10A.

As mentioned earlier, in the above equations, y* represents a delayed, or previous, value of Y. The equation for Y corresponds to a multiplexer function, as shown by the Karnaugh map 1000 in FIG. 10A. FIG. 10B shows a multiplexer 1110 which implements the relationships set forth in the Karnaugh map 1000 of FIG. 10A. In FIG. 10B, j is the input to a first input port of the multiplexer 1110, k is the input to a second input port of the multiplexer 1110, m is the input to a control input of the multiplexer 1110, and Out is the output of the multiplexer 1110.

A multiplexer typically has race problems associated with it, which presents a problem in a design of a flip flop. From FIG. 10A, the following relationship is obtained:

$$Out = j\bar{m} + km = j\bar{m} + km + jk$$

Therefore, to avoid the race problems, the following transformations can be made:

$$Y = y * \bar{C} + y_1 C + y * y_1 \tag{C}$$

$$Y = y * (\bar{C} + y_1) + y_1 C$$

$$Y = y * y_3 + y_1 C$$

Note that the term $y * y_1$ in the top-most of the equations listed above is a redundant term that is used to eliminate the race problem. This redundant term is clearly seen as the dashed region in FIG. 10A (with m=C, j=y*, and k=$y_1$).

Figure 11:
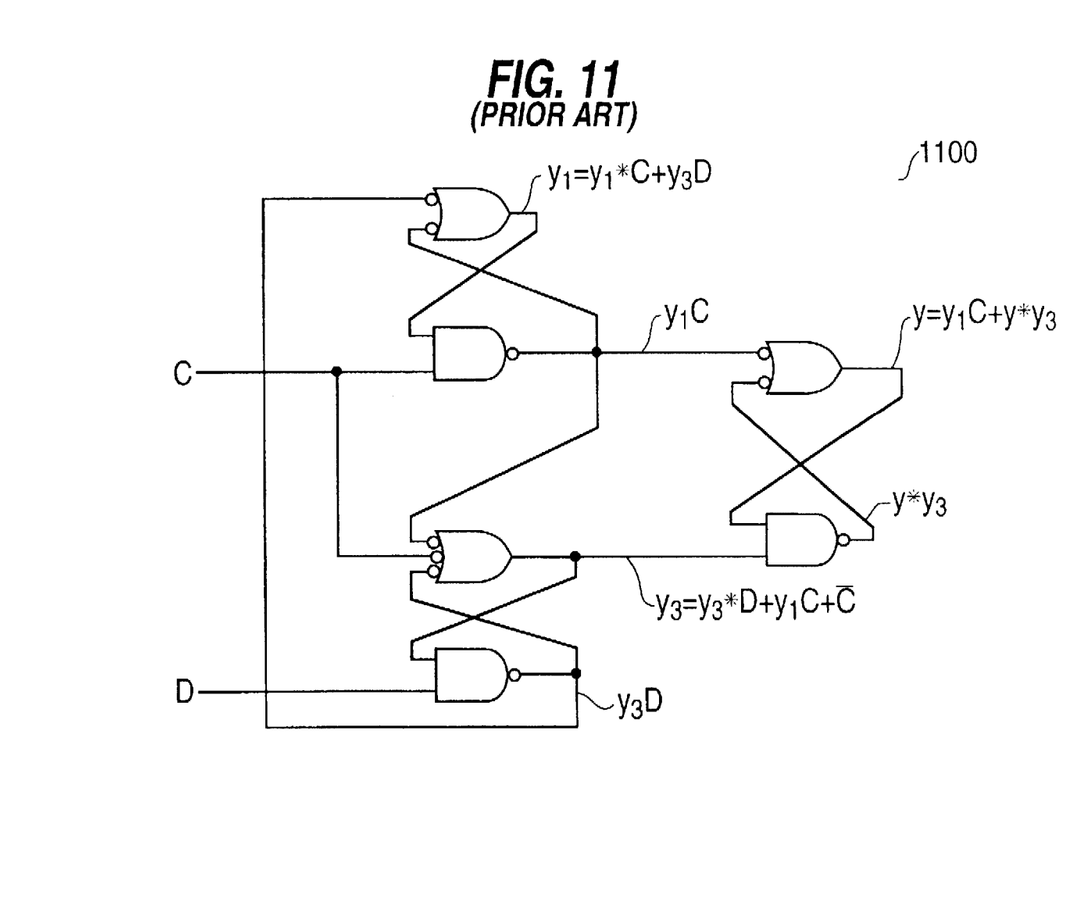
FIG. 11 shows the conventional minimized D-type positive edge-triggered flip-flop obtained as a result.

Equations (A), (B), and (C) provide the basis for the design of a conventional positive edge flip flop, such as the one described by Thomas McCalla, "Digital Logic and Computer Design", 1992 (published by Merrill, New York) and as shown as flip flop 1100 in FIG. 11.

The synthesis of a conventional minimized positive edge-triggered flip flop, as given, for example, by flip flop 1100 in FIG. 11, is an a posteriori exercise in synthesis of asynchronous circuits. This exercise leads to the following conclusions. First, a formal synthesis method can arrive at results that have been produced heuristically, i.e., via a trial-and-error basis. Second, heuristic synthesis methods may give sub-optimal results.

It is therefore desirable to arrive at a more optimal design for a positive edge-triggered flip flop than that which has been achieved for conventional designs.

SUMMARY OF THE INVENTION

It is an object of the invention to provide a positive edge triggered flip flop that has less redundant components than conventional designs.

It is another object of the invention to provide a positive edge triggered flip flop that exhibits less clock skew than conventional designs.

These are other objects are achieved by a positive edge triggered flip flop, which includes a first NAND gate having a first input port configured to receive a data signal, a second input port, and an output port. The flip flop also includes an inverter configured to receive a clock signal on an input port and to output an inverted clock signal on an output port, with the output port of said inverter being connected to said second input port of said first NAND gate. The flip flop further includes a second NAND gate having a first input port connected to receive the clock signal, a second input port, and an output port. The flip flop still further includes a first NOR gate having a first input connected to the output port of the first NAND gate, a second input port connected to the output port of the second NAND gate, and an output port connected to the second input port of the first NAND gate. The flip flop also includes a second NOR gate having a first input port connected to the output port of the second NAND gate, a second input port, and an output port. The flip flop further includes a third NAND gate having a first input port connected to the output port of the second NOR gate, a second input port connected to receive the inverted clock signal from the output port of the inverter, and an output port connected to the second input port of the second NOR gate. An output signal of the positive edge triggered flip flop is output from the output port of the second NOR gate.

The above-mentioned objects and other objects can also be achieved by a positive edge triggered flip flop, which includes a first NAND gate having a first input port configured to receive a data signal, a second input port, and an output port. The flip flop also includes an inverter configured to receive a clock signal on an input port and to output an inverted clock signal on an output port, with the output port of the inverter being connected to said second input port of said first NAND gate. The flip flop further includes a second NAND gate having a first input port connected to receive the clock signal, a second input port, and an output port. The flip flop still further includes a third NAND gate having a first input connected to the output port of the first NAND gate, a second input port connected to the output port of the second NAND gate, and an output port connected to the second input port of the first NAND gate. The flip flop also includes a fourth NAND gate having a first input port connected to the output port of the second NAND gate, a second input port, and an output port. The flip flop further includes a fifth NAND gate having a first input port connected to the output port of the second NAND gate, a second input port connected to receive the inverted clock signal from the output port of the inverter, and an output port connected to the second input port of the fourth NAND gate. An output signal of the positive edge triggered flip flop is output from the output port of the fifth NAND gate.

BRIEF DESCRIPTION OF THE DRAWINGS

These and other objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENTS

Preferred embodiment of the invention will be described with reference to FIGS. 12–15. As discussed earlier, heuristic synthesis methods, such as those used to create conventional positive edge triggered flip flop designs, tend to give sub-optimal results. In particular, according to the invention, a redundancy in the use of the state variable $y_3$ is eliminated. Further, according to the invention, the assignments for the sequences A and B in FIG. 6 are made in a different, improved manner so as to merge state variables $y_1$ and $y_3$ so that a better design is achieved. Each of these two design enhancements as utilized in the preferred embodiments will be described in detail hereinbelow.

Figure 12:
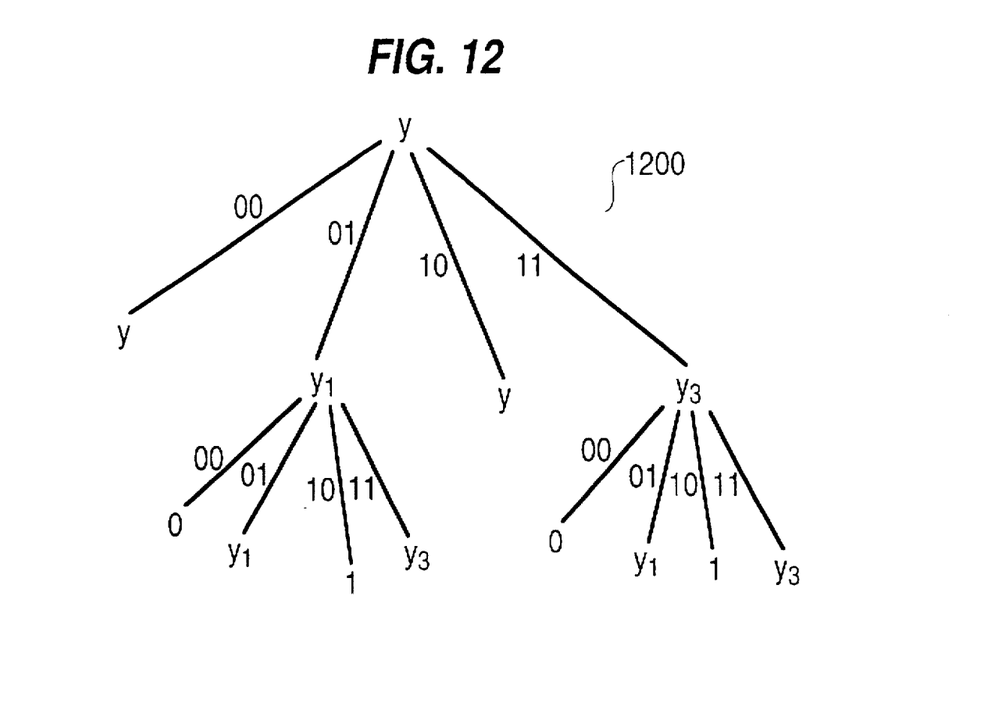
FIG. 12 shows a tree obtained using Vignron's synthesis method, along with values set for various nodes of the tree, in order to obtain a D-type positive edge-triggered flip flop according to the invention.

FIG. 12 corresponds to a Vignron tree 1200, similar to the tree 400 shown in FIG. 4, but with the X's (don't cares) replaced by one's. Thus, according to the invention:

$$y_1 = y_3$$

Figure 13A:
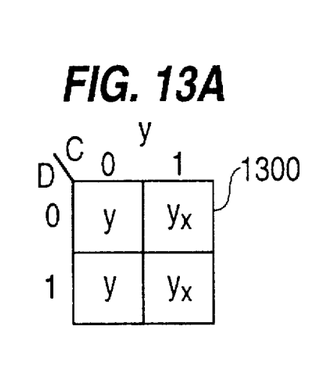
FIGS. 13A and 13B show the Karnaugh maps obtained from the tree of FIG. 12.
Figure 13B:
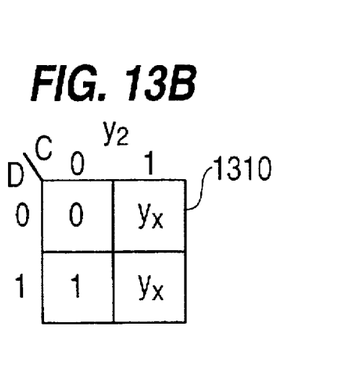

The Karnaugh maps 1300 and 1310 of FIGS. 13A and 13B, respectively, are obtained from Vignron's tree 1200 of FIG. 12, where $y_x$ may be either $y_1$ or $y_3$. From this, the minimum number of states necessary to identify the four distinct sequences are obtained, as shown in Table 5, below.

TABLE 5

Four Distinct States for Flip Flop

| | Time | 0 | 1 | 2 |
|---|---|---|---|---|
| S1 | D | D | D | D |
| | C | 0 | 1 | 1 |
| | Y | y | y | D |
| S2 | D | D | D | D |
| | C | 1 | 0 | 0 |
| | Y | y | y | y |
| S3 | D | 1 | 1 | 0 |
| | C | C | C | C |
| | Y | y | y | y |
| S4 | D | 0 | 1 | 1 |
| | C | C | C | 0 |
| | Y | y | y | y |

From Table 5, the following relationships are obtained:

$$Y = y^* \bar{C} + y_x C \quad \text{(D)}$$

$$y_x = y_x^* \bar{C} + D C \quad \text{(E)}$$

Figure 14:
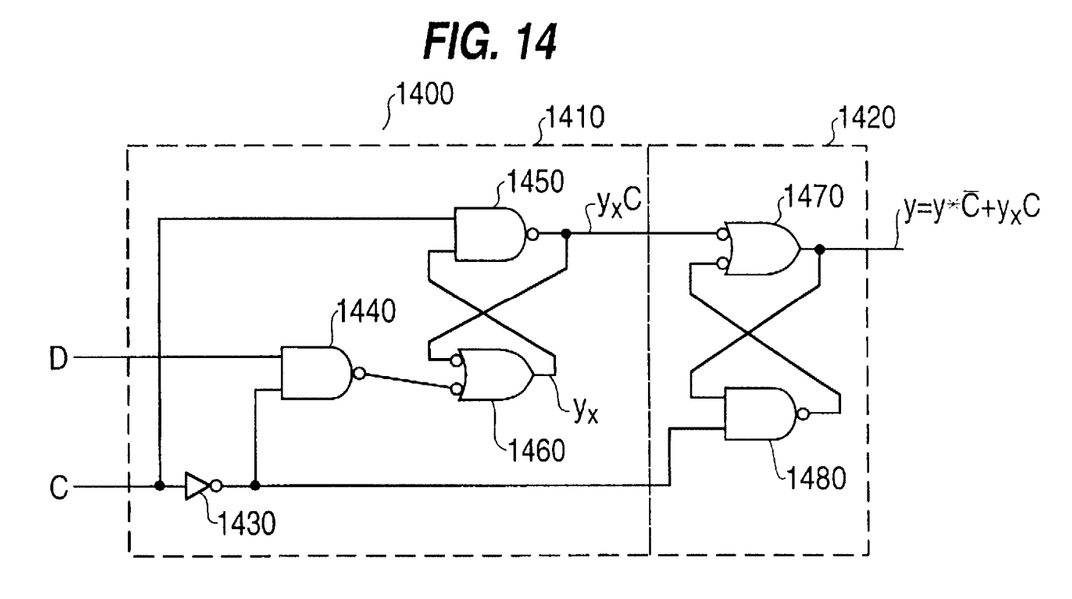
FIG. 14 shows a D-type positive-edge-triggered flip flop according to a first embodiment of the invention.

Based on these two relationships, a positive edge triggered flip flop according to the invention may be implemented. FIG. 14 shows such a positive edge-triggered flip flop according to a first embodiment of the invention.

The positive edge triggered flip flop 1400 includes a master section 1410 and a slave section 1420. The master section 1410 includes an inverter 1430 which is connected to receive the clock signal C, and which outputs an inverted clock signal $\bar{C}$. NAND gate 1440 has a first input port that is connected to receive a data signal D, and a second input port connected to receive the inverted clock signal $\bar{C}$. NAND gate 1450 has a first input port that is connected to receive the clock signal C, and a second input port connected to the output port of a NAND gate 1460. A first input port of NAND gate 1460 is connected to the output port of NAND gate 1450, and a second input port of NAND gate 1460 is connected to the output port of the NAND gate 1440. The output of NAND gate 1450 corresponds to the value $y_x C$, which is one portion needed to provide output Y, as given in Equation (D), above.

The slave section 1420 includes a NAND gate 1470. The NAND gate 1470 has a first input port connected to the output of the NAND gate 1450, and a second input port connected to an output port of a NAND gate 1480. NAND gate 1480 has a first input port connected to the output port of the NAND gate 1470, and a second input port connected to the output of the inverter 1430 so as to receive the inverted clock signal $\bar{C}$. The output of the NAND gate 1470 corresponds to the value $y^* \bar{C} + y_x C$, which corresponds to the value Y according to the invention.

The flip flop 1400 of FIG. 14 is different from the conventional master-slave flip flop 100 of FIG. 1 and the minimized flip flop 1100 of FIG. 11, both of which exhibit clock skew problems. Therefore, the positive edge triggered flip flop 1400 according to the invention is a more stable device than conventional D-type positive edge-triggered flip-flops.

Figure 15:
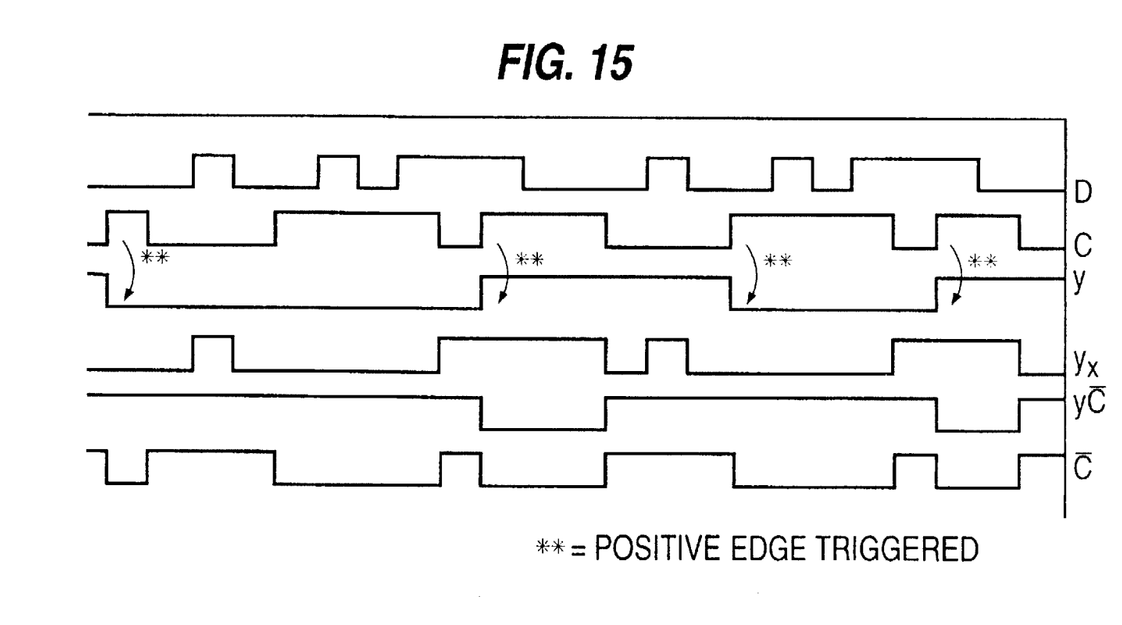
FIG. 15 shows timing diagrams illustrating the characteristics of the positive edge-triggered D-type flip flop according to the invention.

FIG. 15 shows timing diagrams for the positive edge triggered flip flop according to a first embodiment of the invention. The area indicated by a double asterisk (**) in FIG. 15 corresponds to a positive edge of an input clock signal, from which data on the "D" input is clocked into the flip flop, to be output as a Y value on the output port of the flip flop.

Figure 16:
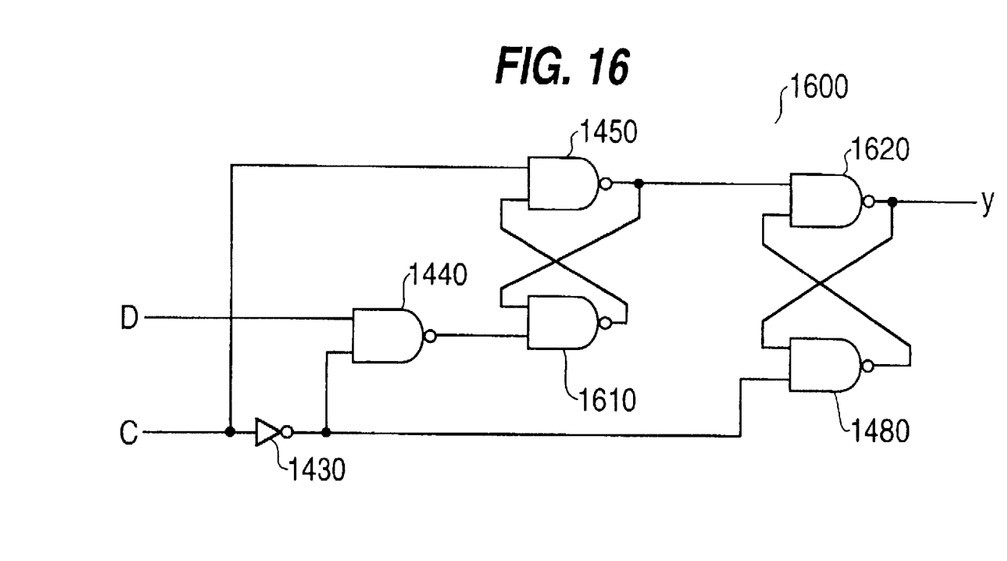
FIG. 16 shows a D-type positive-edge-triggered-flip flop according to a second embodiment of the invention.

While embodiments have been described herein, modification of the described embodiment may become apparent to those of ordinary skill in the art, following the teachings of the invention, without departing from the scope of the invention as set forth in the appended claims. For example, any of the NAND gates can be replaced by an equivalent component, as in the first embodiment. Alternatively, one of ordinary skill in the art will recognize that a positive edge triggered flip flop can be constructed according to the invention using any particular combination of NAND gates, NOR gates, or even exclusive OR (XOR) gates and exclusive NOR (XNOR) gates, as long as the logic circuit accomplishes the functions of the relationships in equations (D) and (E). For example, FIG. 16 shows a second embodiment of the invention. In FIG. 16, flip-flop 1600 has an all-NAND gate configuration, with the NOR Gate 1460 of FIG. 14 replaced by NAND Gate 1610, and with the NOR Gate 1470 of FIG. 14 replaced by NAND Gate 1620.

What is claimed is:

1. A positive edge triggered flip flop, comprising:

a first NAND gate having a first input port configured to receive a data signal, a second input port, and an output port;

an inverter configured to receive a clock signal on an input port and to output an inverted clock signal on an output port, the output port of the inverter being connected to the second input port of the first NAND gate;

a second NAND gate having a first input port connected to receive the clock signal, a second input port, and an output port;

a first NOR gate having a first input port connected to the output port of the first NAND gate, a second input port connected to the output port of the second NAND gate, and an output port connected to the second input port of the second NAND gate;

a second NOR gate having a first input port connected to the output port of the second NAND gate, a second input port, and an output port; and a third NAND gate having a first input port connected to the output port of the second NOR gate, a second input port connected to receive the inverted clock signal from the output port of the inverter, and an output port connected to the second input port of the second NOR gate, wherein an output signal of the positive edge triggered flip flop is output from the output port of the second NOR gate.

2. A positive edge triggered flip flop according to claim 1, wherein the inverter, first NAND gate, second NAND gate, and first NOR gate comprise a master section of the flip flop.

3. A positive edge triggered flip flop according to claim 2, wherein the second NOR gate and third NAND gate comprise a slave section of the flip flop.

4. A positive edge triggered flip flop, comprising:

a first NAND gate having a first input port configured to receive a data signal, a second input port, and an output port;

an inverter configured to receive a clock signal on an input port and to output an inverted clock signal on an output port, the output port of the inverter being connected to the second input port of the first NAND gate;

a second NAND gate having a first input port connected to receive the clock signal, a second input port, and an output port;

a third NAND gate having a first input port connected to the output port of the first NAND gate, a second input port connected to the output port of the second NAND gate, and an output port connected to the second input port of the second NAND gate;

a fourth NAND gate having a first input port connected to the output port of the second NAND gate, a second input port, and an output port; and a fifth NAND gate having a first input port connected to the output port of the fourth NAND gate, a second input port connected to receive the inverted clock signal from the output port of the inverter, and an output port connected to the second input port of the fourth NAND gate, wherein an output signal of the positive edge triggered flip flop is output from the output port of the fourth NAND gate.

5. A positive edge triggered flip flop according to claim 4, wherein the inverter, first NAND gate, second NAND gate, and third NAND gate comprise a master section of the flip flop.

6. A positive edge triggered flip flop according to claim 5, wherein the fourth NAND gate and fifth NAND gate comprise a slave section of the flip flop.

7. A positive edge-triggered flip-flop according to claim 1, wherein the output port of the second NAND gate not being connected to the input port of the inverter.

8. A positive edge-triggered flip-flop according to claim 1, wherein the output port of the first NAND gate is only connected to the first input port of the first NOR gate, the output port of the first NAND gate not being connected to the input port of the inverter.

9. A positive edge-triggered flip-flop according to claim 4, wherein the output port of the second NAND gate not being connected to the input port of the inverter.

10. A positive edge-triggered flip-flop according to claim 4, wherein the output port of the first NAND gate is only connected to the first input port of the third NAND gate, the output port of the first NAND gate not being connected to the input port of the inverter.

* * * * *